US012804995B2

(12) United States Patent
Saremi et al.

(10) Patent No.: US 12,804,995 B2

(45) Date of Patent: Nov. 17, 2026

(54) SOURCE/DRAIN ISOLATION OF TOP AND BOTTOM TIERS OF 3D FIELD-EFFECT TRANSISTORS

(71) Applicant: Samsung Electronics Co., Ltd., Suwon-si (KR)

(72) Inventors: Mehdi Saremi, Danville, CA (US); Ming He, San Jose, CA (US); Aravindh Kumar, Mountain View, CA (US); Muhammed Ahosan Ul Karim, San Jose, CA (US); Rebecca Park, Mountain View, CA (US); Harsono Simka, Saratoga, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 398 days.

(21) Appl. No.: 18/486,884

(22) Filed: Oct. 13, 2023

(65) Prior Publication Data

US 2025/0072098 A1 Feb. 27, 2025

Related U.S. Application Data

(60) Provisional application No. 63/533,982, filed on Aug. 22, 2023.

(51) Int. Cl.

| | |
|---|---|
| ***H01L 21/68*** | (2006.01) |
| ***H10D 62/13*** | (2025.01) |
| ***H10D 84/01*** | (2025.01) |
| ***H10D 84/03*** | (2025.01) |

(52) U.S. Cl.

CPC ......... *H10D 84/017* (2025.01); *H10D 62/151* (2025.01); *H10D 84/0188* (2025.01); *H10D 84/038* (2025.01)

(58) Field of Classification Search

CPC ............... H10D 84/017; H10D 62/151; H10D 84/0188; H10D 84/038; H10D 62/121; H10D 84/8312; H10D 84/85; H10D 88/00; H10D 88/01

USPC .......................................................... 257/369

See application file for complete search history.

(56) References Cited

U.S. PATENT DOCUMENTS

| | | | | |
|---|---|---|---|---|
| 9,224,811 | B2 * | 12/2015 | Cheng | H10D 62/8164 |
| 9,859,174 | B1 | 1/2018 | Bi et al. | |
| 10,134,640 | B1 * | 11/2018 | Chiang | H10D 30/797 |
| 10,453,752 | B2 | 10/2019 | Van Dal et al. | |
| 10,700,067 | B2 * | 6/2020 | Rubin | H10D 84/85 |
| 10,770,460 | B2 | 9/2020 | Rubin | |

(Continued)

*Primary Examiner* — Vu A Vu

(74) *Attorney, Agent, or Firm* — Womble Bond Dickinson (US) LLP

(57) ABSTRACT

A method of manufacturing a three-dimensional field-effect transistor including an upper field-effect transistor stacked on a lower field-effect transistor. The method includes epitaxially growing source/drain regions of the lower field-effect effect transistor, growing a sacrificial layer on an upper surface of the source/drain regions, and epitaxially growing source/drain regions of the upper field-effect transistor on the sacrificial layer. The sacrificial layer is a seed layer for the source/drain regions of the upper field-effect transistor. The method also includes selectively etching the sacrificial layer to form a gap between the source/drain regions of the lower field-effect transistor and the source/drain regions of the upper field-effect transistor, and depositing an oxide layer in the gap.

11 Claims, 2 Drawing Sheets

(56) References Cited

U.S. PATENT DOCUMENTS

| | | | | |
|---|---|---|---|---|
| 10,957,761 | B2 | 3/2021 | Yeh et al. | |
| 11,024,548 | B2 * | 6/2021 | Van Dal | H01L 21/02603 |
| 11,177,369 | B2 | 11/2021 | Yu et al. | |
| 11,450,666 | B2 | 9/2022 | Khaderbad et al. | |
| 11,764,113 | B2 * | 9/2023 | Smith | H10D 30/6735<br>438/199 |
| 2020/0212038 | A1 * | 7/2020 | Rachmady | H10D 84/0167 |
| 2023/0105783 | A1 | 4/2023 | Gaul et al. | |
| 2023/0118700 | A1 | 4/2023 | Lin et al. | |
| 2023/0124549 | A1 | 4/2023 | Chang et al. | |

* cited by examiner

SOURCE/DRAIN ISOLATION OF TOP AND BOTTOM TIERS OF 3D FIELD-EFFECT TRANSISTORS

CROSS-REFERENCE TO RELATED APPLICATION(S)

The present application claims priority to and the benefit of U.S. Provisional Application No. 63/533,982, filed Aug. 22, 2023 in the U.S. Patent and Trademark Office, the entire content of which is incorporated herein by reference.

BACKGROUND

1. Field

The present disclosure relates to methods of manufacturing a three-dimensional field-effect transistor.

2. Description of the Related Art

To maintain Moore's law like growth in the semiconductor industry, it has been proposed to manufacture stacked three-dimensional field-effect transistors (3D FETs) in which a p-type (PMOS) field-effect transistor is stacked on an n-type (NMOS) field-effect transistor (or vice versa). 3D FETs increase scaling by reducing physical constraints on gate length, spacer thickness, and contact size. In this manner, 3D FETs enable the gate, the spacers, and contacts to be optimized for performance or energy consumption. However, 3D FETs present the challenge of separating the NMOS and PMOS transistors from each other in the vertical direction. Related art 3D FETs have a tight process margin issue that makes vertical separation challenging.

The above information disclosed in this Background section is only for enhancement of understanding of the background of the invention and therefore it may contain information that does not constitute prior art.

SUMMARY

The present disclosure relates to various embodiments of a method of manufacturing a three-dimensional field-effect transistor (3D-FET) including an upper field-effect transistor stacked on a lower field-effect transistor. In one embodiment, the method includes epitaxially growing source/drain regions of the lower field-effect effect transistor, growing a sacrificial layer on an upper surface of the source/drain regions, and epitaxially growing source/drain regions of the upper field-effect transistor on the sacrificial layer. The sacrificial layer is a seed layer for the source/drain regions of the upper field-effect transistor. The method also includes selectively etching the sacrificial layer to form a gap between the source/drain regions of the lower field-effect transistor and the source/drain regions of the upper field-effect transistor, and depositing an oxide layer in the gap.

The sacrificial layer may include silicon-germanium (SiGe), such as $Si_xGe_{1-x}$.

The lower field-effect transistor may an n-type field-effect transistor and the upper field-effect transistor may be a p-type field-effect transistor.

The lower field-effect transistor may be a p-type field-effect transistor and the upper field-effect transistor may be an n-type field-effect transistor.

A thickness of the sacrificial layer may be less than a thickness of each of the source/drain regions of the upper field-effect transistor and the source/drain regions of the lower field-effect transistor.

A thickness of the oxide layer may be less than a thickness of each of the source/drain regions of the upper field-effect transistor and the source/drain regions of the lower field-effect transistor.

The present disclosure also relates to various embodiments of a three-dimensional field-effect transistor. In one embodiment, the three-dimensional field-effect transistor includes a lower field-effect transistor and an upper field-effect transistor stacked on the lower field-effect transistor. Each of the lower field-effect transistor and the upper field-effect transistor includes a source region, a drain region, a channel region between the source region and the drain region, and a gate on the channel. The source region and the drain region of the lower field-effect transistor are separated from the source region and the drain region of the upper field-effect transistor by an oxide layer.

The lower field-effect transistor may an n-type field-effect transistor and the upper field-effect transistor may be a p-type field-effect transistor.

The lower field-effect transistor may be a p-type field-effect transistor and the upper field-effect transistor may be an n-type field-effect transistor.

A thickness of the oxide layer may be less than a thickness of each of the source/drain regions of the upper field-effect transistor and the source/drain regions of the lower field-effect transistor.

This summary is provided to introduce a selection of concepts that are further described below in the detailed description. This summary is not intended to identify key or essential features of the claimed subject matter, nor is it intended to be used in limiting the scope of the claimed subject matter. One or more of the described features and/or tasks may be combined with one or more other described features and/or tasks to provide a workable device and/or a workable method.

BRIEF DESCRIPTION OF THE DRAWINGS

The features and advantages of embodiments of the present disclosure will be better understood by reference to the following detailed description when considered in conjunction with the accompanying figures. In the figures, like reference numerals are used throughout the figures to reference like features and components. The figures are not necessarily drawn to scale.

DETAILED DESCRIPTION

Figure 1:
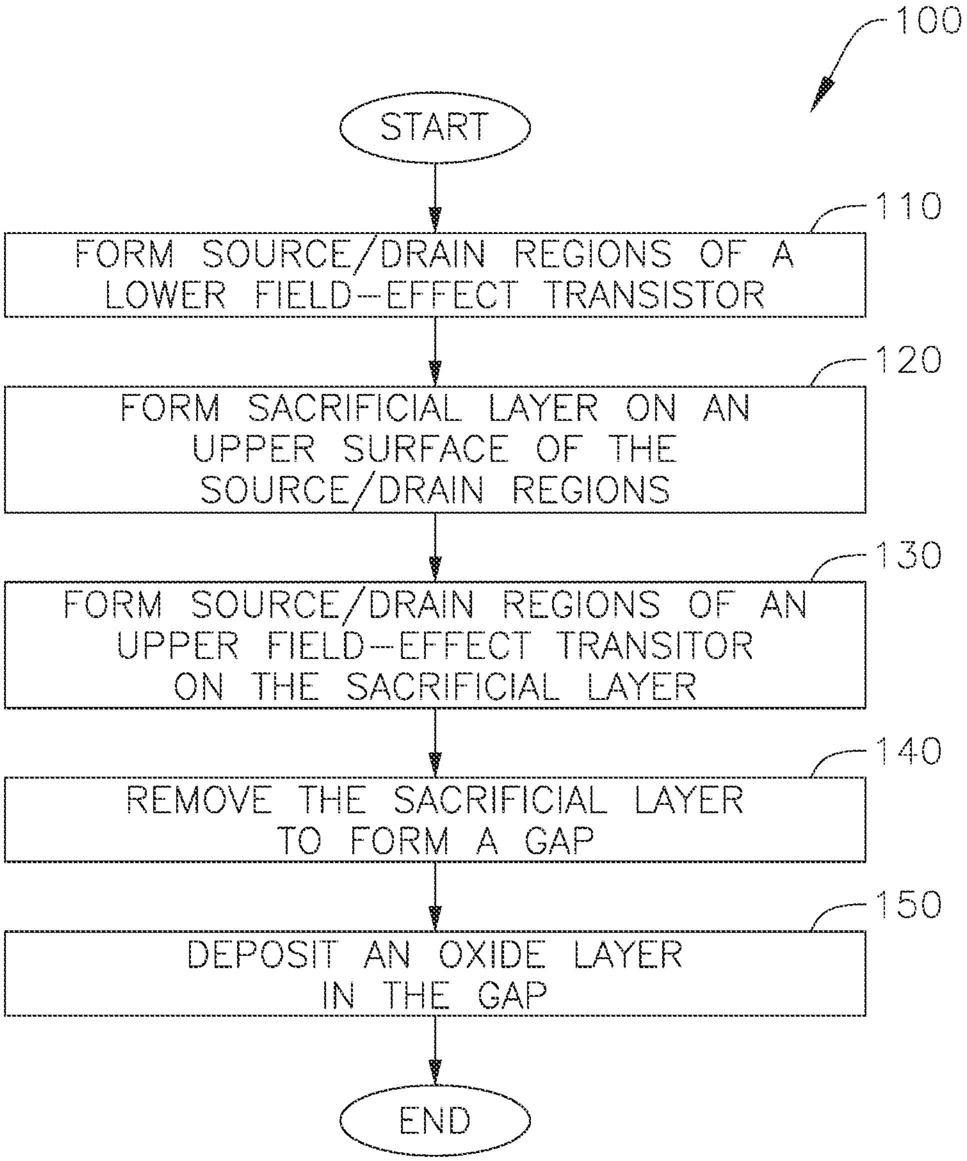
FIG. 1 is a flowchart illustrating tasks of a method of manufacturing a three-dimensional field-effect transistor (3D-FET) according to one embodiment of the present disclosure.

The present disclosure relates to various embodiments of a method of manufacturing a three-dimensional field-effect transistor (3D-FET) including an upper field-effect transistor stacked on a lower field-effect transistor. The method according to various embodiments of the present disclosure isolates the source/drain regions of the lower field-effect effect transistor from the source/drain regions of the upper field-effect effect transistor.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figures 2A, 2B, 2C, 2D, 2E:
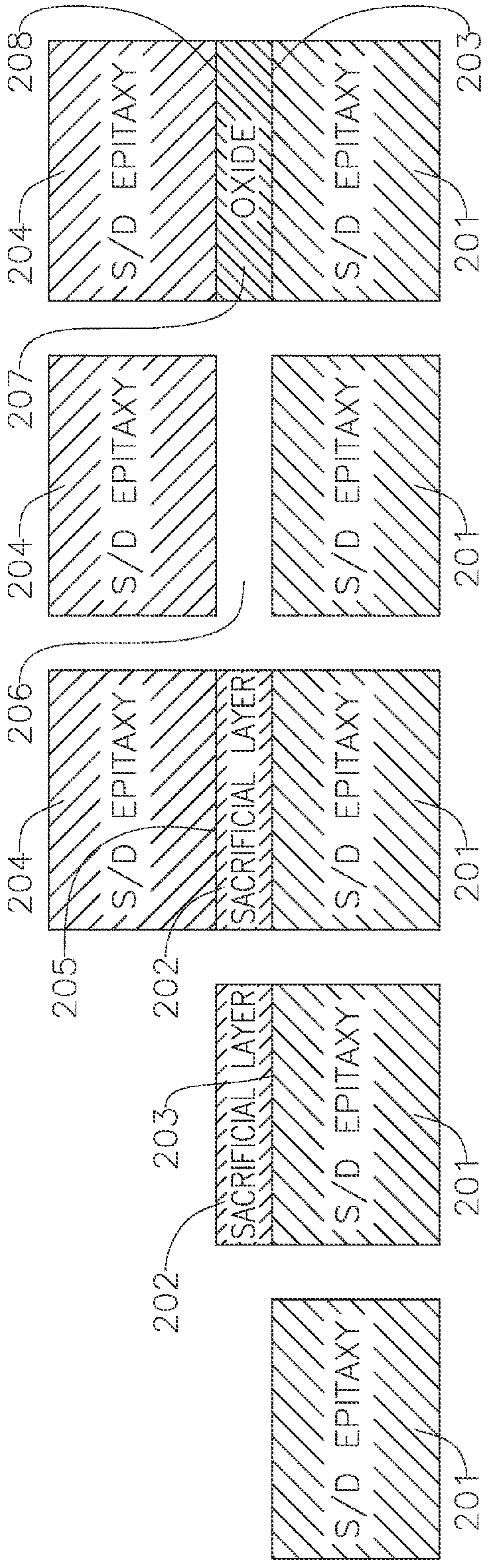
FIGS. 2A-2E depict the tasks of the method of manufacturing the 3D-FET according to the embodiment of FIG. 1.

With reference now FIGS. 1 and 2A-2E, a method 100 of manufacturing a three-dimensional stacked field-effect transistor (3D FET) according to one embodiment of the present disclosure includes a task 110 of forming (e.g., epitaxially growing) source/drain regions 201 of a lower field-effect transistor (lower FET) on opposite sides of a channel region (e.g., epitaxially growing the source/drain regions 201 on a substrate, such as a bulk silicon (Si) substrate).

In the illustrated embodiment, the method 100 also includes a task 120 of forming (e.g., growing) a sacrificial layer 202 on an upper surface 203 of the source/drain regions 201 formed in task 110. In one or more embodiments, the sacrificial layer 202 may be formed of silicon-germanium (SiGe), such as $Si_xGe_{1-x}$. In one or more embodiments, the thickness of the sacrificial layer 202 may be less than the thickness of the source/drain regions 201 formed in task 110 (e.g., the thickness of the sacrificial layer 202 may be less than half the thickness of the source/drain regions 201).

In the illustrated embodiment, the method 100 also includes a task 130 of forming (e.g., epitaxially growing) source/drain regions 204 of an upper field-effect transistor on an upper surface 205 of the sacrificial layer 202 formed in task 120. The sacrificial layer 202 formed in task 120 is a seed layer for the source/drain regions 204 formed in task 130. In one or more embodiments in which the sacrificial layer 202 is formed of $Si_xGe_{1-x}$, the sacrificial layer 202 is configured to improve the controllability and quality of the source/drain regions 204 grown from the sacrificial layer 202. Additionally, in one or more embodiments, the thickness of the source/drain regions 204 of an upper field-effect transistor may be the same (or substantially the same) as the thickness of the source/drain regions 201 of the lower field-effect transistor.

In the illustrated embodiment, the method 100 also includes a task 140 of removing (e.g., selectively etching) the sacrificial layer 202 formed in task 120. In one or more embodiments, the etch may be selective to SiGe. Following the task 140 of removing the sacrificial layer 202, a gap 206 is formed between the source/drain regions 201 of the lower field-effect transistor and the source/drain regions 204 of the upper field-effect transistor.

In the illustrated embodiment, the method 100 also includes a task 150 of depositing an oxide layer 207 in the gap 206 (formed in task 140) between the source/drain regions 201 of the lower field-effect transistor and the source/drain regions 204 of the upper field-effect transistor. In the illustrated embodiment, the oxide layer 207 fills the gap 206 left by the removal of the sacrificial layer 202 (e.g., the oxide layer 207 contacts the upper surface 203 of the source/drain regions 201 of the lower field-effect transistor and a lower surface 208 of the source/drain regions 204 of the upper field effect transistor). The oxide layer 207 isolates the source/drain regions 201 of the lower field-effect transistor from the source/drain regions 204 of the upper field-effect transistor.

In this manner, the method 100 of manufacturing the 3D FET is configured to achieve proper isolation between the source/drain regions 201, 204 of the upper and lower field-effect transistors and improve the controllability and quality of the source/drain regions 204 of the upper field-effect transistor because the sacrificial SiGe layer 202 is the seeding layer for the source/drain regions 204 of the upper field-effect transistor.

In one or more embodiments, the method 100 also includes one or more tasks of forming source/drain contacts in contact with the source/drain regions 201, 204 of the upper and lower FETs, and forming metal gate structures for the upper and lower FETs.

While this invention has been described in detail with particular references to embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention.

What is claimed is:

1. A method of manufacturing a three-dimensional field-effect transistor including an upper field-effect transistor stacked on a lower field-effect transistor, the method comprising:

epitaxially growing source/drain regions of the lower field-effect effect transistor;

growing a sacrificial layer on an upper surface of the source/drain regions of the lower field-effect transistor;

epitaxially growing source/drain regions of the upper field-effect transistor on the sacrificial layer, wherein the sacrificial layer functions a seed layer for the epitaxially growing of the source/drain regions of the upper field-effect transistor;

selectively etching the sacrificial layer to form a gap between the source/drain regions of the lower field-effect transistor and the source/drain regions of the upper field-effect transistor; and depositing an oxide layer in the gap.

2. The method of claim 1, wherein a thickness of the sacrificial layer is less than a thickness of each of the source/drain regions of the upper field-effect transistor and the source/drain regions of the lower field-effect transistor.

3. The method of claim 1, wherein a thickness of the oxide layer is less than a thickness of each of the source/drain regions of the upper field-effect transistor and the source/drain regions of the lower field-effect transistor.

4. The method of claim 1, wherein the lower field-effect transistor is an n-type field-effect transistor and the upper field-effect transistor is a p-type field-effect transistor.

5. The method of claim 1, wherein the lower field-effect transistor is a p-type field-effect transistor and the upper field-effect transistor is an n-type field-effect transistor.

6. A method of manufacturing a three-dimensional field-effect transistor including an upper field-effect transistor stacked on a lower field-effect transistor, the method comprising:

epitaxially growing source/drain regions of the lower field-effect effect transistor;

growing a sacrificial layer on an upper surface of the source/drain regions of the lower field-effect transistor;

epitaxially growing source/drain regions of the upper field-effect transistor on the sacrificial layer, wherein the sacrificial layer is a seed layer for the source/drain regions of the upper field-effect transistor;

selectively etching the sacrificial layer to form a gap between the source/drain regions of the lower field-effect transistor and the source/drain regions of the upper field-effect transistor; and depositing an oxide layer in the gap, wherein the sacrificial layer comprises silicon-germanium (SiGe).

7. The method of claim 6, wherein the silicon-germanium is $Si_xGe_{1-x}$.

8. A three-dimensional field-effect transistor comprising:

a lower field-effect transistor comprising a source region, a drain region, a channel region between the source region and the drain region, and a gate on the channel;

an upper field-effect transistor stacked on the lower field-effect transistor, wherein each of the lower field-effect transistor and the upper field-effect transistor comprises a source region, a drain region, a channel region between the source region and the drain region, and a gate on the channel, wherein the source region and the drain region of the lower field-effect transistor are separated from the source region and the drain region of the upper field-effect transistor by an oxide layer, and wherein a crystalline configuration of the source region and the drain region of the upper field-effect transistor is independent of a crystalline configuration of the oxide layer.

9. The three-dimensional field-effect transistor of claim 8, wherein the lower field-effect transistor is an n-type field-effect transistor and the upper field-effect transistor is a p-type field-effect transistor.

10. The three-dimensional field-effect transistor of claim 8, wherein the lower field-effect transistor is a p-type field-effect transistor and the upper field-effect transistor is an n-type field-effect transistor.

11. The three-dimensional field-effect transistor of claim 8, wherein a thickness of the oxide layer is less than a thickness of each of the source/drain regions of the upper field-effect transistor and the source/drain regions of the lower field-effect transistor.

* * * * *